United States Patent
Alshawabkeh et al.

(10) Patent No.: US 11,586,976 B2
(45) Date of Patent: Feb. 21, 2023

(54) METHOD AND APPARATUS FOR CREATING TESTS FOR EXECUTION IN A STORAGE ENVIRONMENT

(71) Applicant: EMC IP HOLDING COMPANY LLC, Hopkinton, MA (US)

(72) Inventors: Malak Alshawabkeh, Franklin, MA (US); Motasem Awwad, Franklin, MA (US); Samer Badran, Wakefield, MA (US)

(73) Assignee: Dell Products, L.P., Hopkinton, MA (US)

( * ) Notice: Subject to any disclaimer, the term of this patent is extended or adjusted under 35 U.S.C. 154(b) by 876 days.

(21) Appl. No.: 16/519,046

(22) Filed: Jul. 23, 2019

(65) Prior Publication Data

US 2021/0027189 A1    Jan. 28, 2021

(51) Int. Cl.
  *G06N 20/00* (2019.01)
  *G06N 10/00* (2022.01)
  *G11C 29/36* (2006.01)

(52) U.S. Cl.
  CPC ............. *G06N 20/00* (2019.01); *G11C 29/36* (2013.01)

(58) Field of Classification Search
  None
  See application file for complete search history.

(56) References Cited

U.S. PATENT DOCUMENTS

| | | | |
|---|---|---|---|
| 7,496,876 B1 * | 2/2009 | Selvam .................. | G06F 30/398 716/51 |
| 2006/0036920 A1 * | 2/2006 | Swaminathan .............................. | G01R 31/318555 714/733 |
| 2006/0122817 A1 * | 6/2006 | Baumgartner .......... | G06F 30/33 703/14 |
| 2007/0180326 A1 * | 8/2007 | Hwang ............... | G06F 11/3688 714/38.1 |
| 2008/0148247 A1 * | 6/2008 | Galler ................. | G06F 11/3684 717/154 |
| 2015/0379430 A1 * | 12/2015 | Dirac .................... | G06N 20/00 706/12 |
| 2016/0026653 A1 * | 1/2016 | Caro ................... | G06F 16/1752 707/692 |

* cited by examiner

*Primary Examiner* — Cynthia Britt
*Assistant Examiner* — Dipakkumar B Gandhi
(74) *Attorney, Agent, or Firm* — Anderson Gorecki LLP

(57) ABSTRACT

Testcase recommendations are generated for a testcase creator application by training a learning function using metadata of previously generated testcases by parsing the metadata into steptasks, and providing the parsed metadata to the learning function to enable the learning function to determine relationships between the steptasks of the previously generated testcases, and using, by the testcase creator application, the trained learning function to obtain a predicted subsequent steptask for a given type of testcase to be generated. Each steptask describes one of the steps of the testcase using a concatenation of a step number of the one of the steps of the testcase, a module and a submodule to be used to perform of the one of the steps of the testcase, and a function to be performed at the one of the steps of the testcase.

14 Claims, 7 Drawing Sheets

METHOD AND APPARATUS FOR CREATING TESTS FOR EXECUTION IN A STORAGE ENVIRONMENT

BACKGROUND

This disclosure relates to computing systems and related devices and methods, and, more particularly, to a method and apparatus for creating tests for execution in a storage environment.

SUMMARY

The following Summary and the Abstract set forth at the end of this application are provided herein to introduce some concepts discussed in the Detailed Description below. The Summary and Abstract sections are not comprehensive and are not intended to delineate the scope of protectable subject matter, which is set forth by the claims presented below.

All examples and features mentioned below can be combined in any technically possible way.

In some embodiments, a method of generating recommendations for a testcase creator application includes the steps of training a learning function using metadata of previously generated testcases by parsing the metadata into steptasks and providing the parsed metadata to the learning function to enable the learning function to determine relationships between the steptasks of the previously generated testcases, and using, by the testcase creator application, the trained learning function to obtain a predicted subsequent steptask for a given type of testcase to be generated. In some embodiments, each of the previously generated testcases includes a plurality of steps, and the step of parsing the metadata into steptasks includes creating a steptask for each of the plurality of steps. In some embodiments, each steptask describes one of the steps of the testcase using a concatenation of a step number of the one of the steps of the testcase, a module and a submodule to be used to perform of the one of the steps of the testcase, and a function to be performed at the one of the steps of the testcase.

In some embodiments, using the trained learning function to obtain a predicted subsequent steptask for a given type of testcase to be generated comprises obtaining a seed steptask by the testcase creator application, providing the seed steptask to the learning function, and receiving by the testcase creator application, the predicted subsequent steptask. In some embodiments, the predicted subsequent steptask is based on the given type of testcase to be generated and the seed steptask. In some embodiments, the seed steptask is a steptask of a new testcase to be generated by the testcase creator application. In some embodiments, the seed steptask is a first steptask of the new testcase to be generated by the testcase creator application.

In some embodiments, the method further includes the step of using the parsed metadata to determine duplicate testcases. In some embodiments, the step of using the parsed metadata comprises using the steptasks to create testcase fingerprints for each of the previously generated testcases, and comparing the testcase fingerprints to determine the duplicate testcases.

In some embodiments, the method further includes the step of analyzing the output of the learning function using a testcase rules engine to validate the output of the learning function.

In some embodiments, a storage environment includes a plurality of storage systems, a testcase creator application configured to create testcases to be executed in the storage environment, and a testcase automation generator. The testcase automation generator containing control logic configured to train a learning function using metadata of previously generated testcases by parsing the metadata into steptasks and providing the parsed metadata to the learning function to enable the learning function to determine relationships between the steptasks of the previously generated testcases, receive, as input from the testcase creator application, a type of testcase to be generated, use the trained learning function to obtain a predicted subsequent steptask based on the type of testcase to be generated, and provide the predicted subsequent steptask to the testcase creator application.

In some embodiments, each of the previously generated testcases includes a plurality of steps, and the control logic configured to parse the metadata into steptasks is further configured to create a steptask for each of the plurality of steps. In some embodiments, each steptask describes one of the steps of the testcase using a concatenation of a step number of the one of the steps of the testcase, a module and a submodule to be used to perform of the one of the steps of the testcase, and a function to be performed at the one of the steps of the testcase.

In some embodiments, the control logic configured to use the trained learning function to obtain a predicted subsequent steptask for a given type of testcase to be generated comprises control logic configured to obtain a seed steptask for the testcase. In some embodiments, the predicted subsequent steptask is based on the given type of testcase to be generated and the seed steptask. In some embodiments, the seed steptask is a steptask of a new testcase to be generated by the testcase creator application. In some embodiments, the seed steptask is a first steptask of the new testcase to be generated by the testcase creator application.

In some embodiments, the storage environment further includes control logic configured to use the parsed metadata by the learning function to determine duplicate testcases. In some embodiments, the control logic configured to use the parsed metadata is configured to use the steptasks to create testcase fingerprints for each of the previously generated testcases, and compare the testcase fingerprints to determine the duplicate testcases.

In some embodiments, the storage environment further includes a testcase rules engine, and control logic configured to analyze the output of the learning function using the testcase rules engine to validate the output of the learning function.

DETAILED DESCRIPTION

Figure 1:
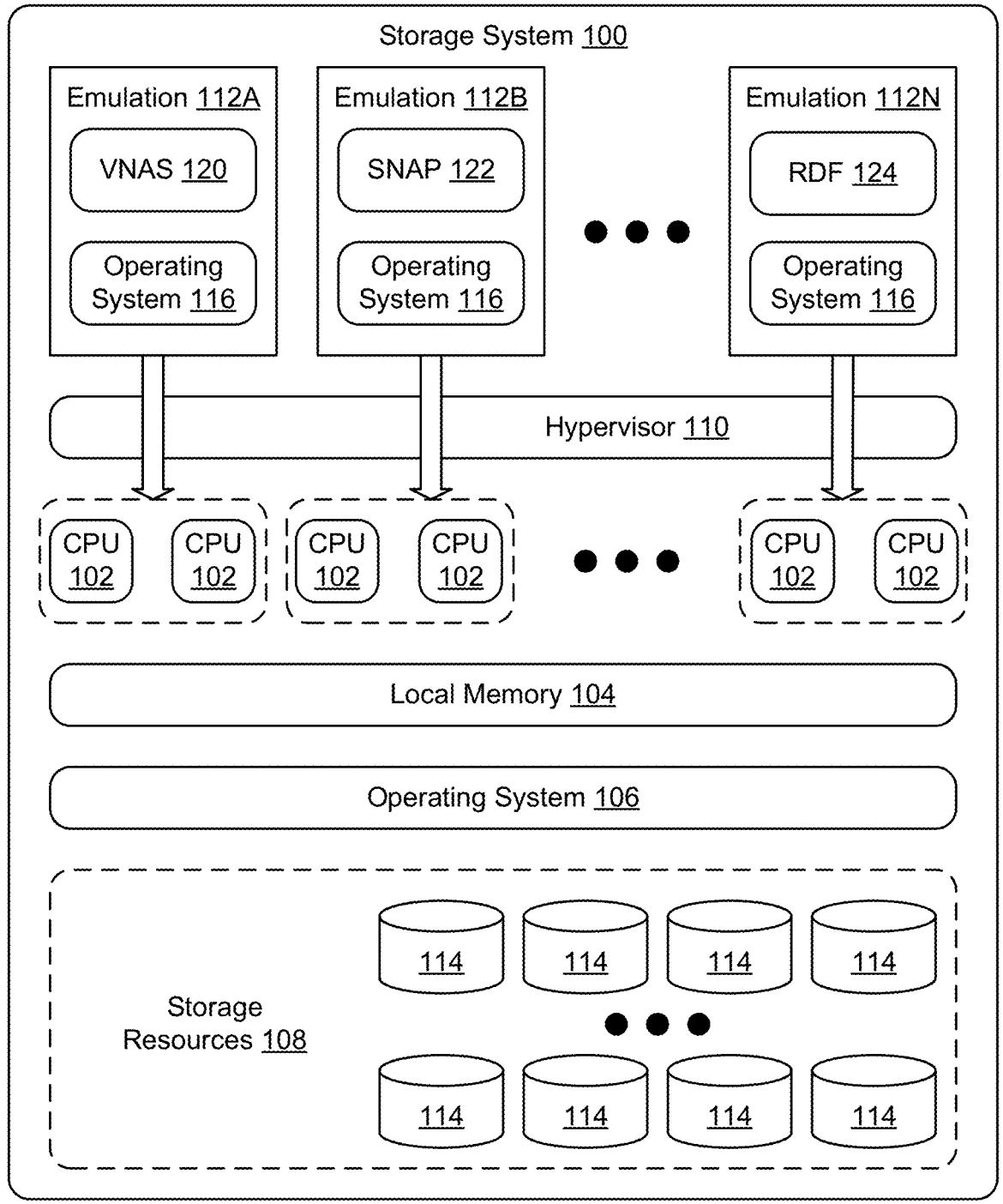
FIG. 1 is a functional block diagram of an example storage system according to some embodiments.
Figure 2:
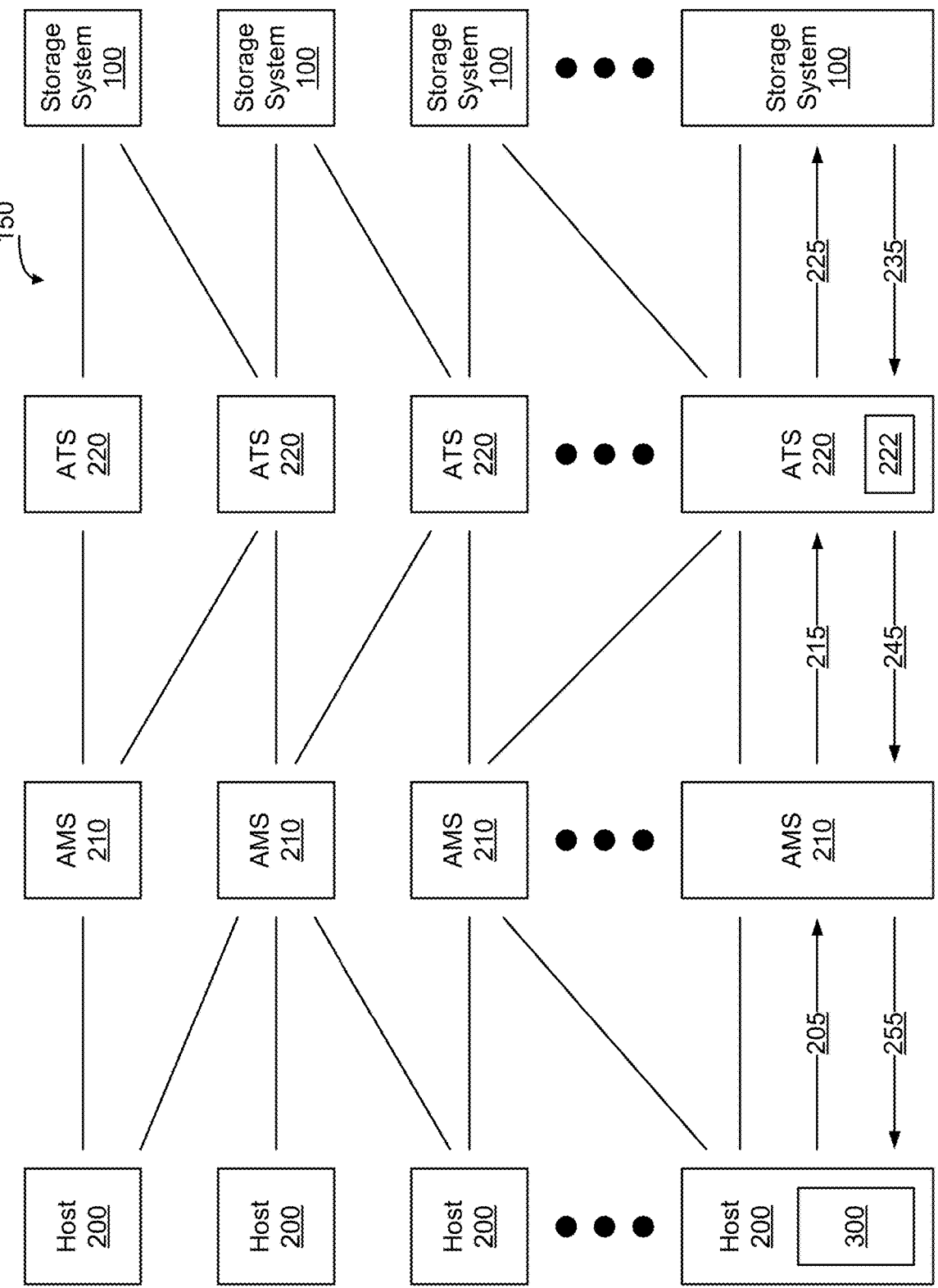
FIG. 2 is a functional block diagram of a storage environment including multiple storage systems according to some embodiments.

FIG. 1 is a functional block diagram of an example storage system 100 for use in a storage environment 150 (see FIG. 2). As shown in FIG. 1, the storage system 100 has physical resources including a number of CPU processor cores 102, local memory 104, operating system 106, storage resources 108, and other physical resources. A hypervisor 110 abstracts the physical resources of the storage system 100 from emulations 112, and allocates physical resources of storage system 100 for use by the emulations 112. In some embodiments, a given storage system 100 may have physical storage resources 108 that are implemented using an array of physical storage devices 114, which may be implemented using optical disc drives or a number of other storage technologies.

Each emulation 112 has an emulation operating system 116 and one or more application processes running in the context of the emulation operating system 116. For example, in some embodiments, one or more of the emulations 112 instantiated on storage system 100 implements one or more Virtual Network Attached Storage (VNAS) software applications (VNAS) 120 configured to enable the emulation 112 to implement a VNAS server on a communication network. Other emulations implement other applications, such as a snapshot application (SNAP) 122, configured to enable the storage system 100 to provide point in time data copying, or a Remote Data Forwarding application 124, configured to enable data mirroring between similarly configured storage systems 100. Multiple other applications may likewise be implemented in a storage system and the illustrated example applications are merely provided as an example.

As is clear from FIG. 1, storage systems are complex systems and may be configured in multiple ways to manage data stored in storage resources 108 and to provide access to that data. Each time a feature is added to an application or the application is changed, or when the storage system 100 itself is reconfigured to implement a new function, the storage system 100 and its operation relative to other storage systems 100 in the storage environment 150 should be tested to determine whether it is operating properly. For example, if RDF application 124 is to be used to mirror a portion of the data stored in storage resources 108 to a second storage system 100, the mirroring environment will need to be tested to ensure that data is being properly copied between the two storage systems 100. Even a minor change in an application flow or addition of any newly developed code can seriously affect the execution of the storage system 100 or the overall execution of the storage environment 150.

Accordingly, test automation software (see FIG. 3) is used to design tests that are dispatched and execute in the storage environment 150 to test whether a storage system 100 or set of storage systems 100 is operating as intended. Unfortunately, designing tests is labor intensive and relies on personal experience of the quality engineer tasked with testing the storage system 100. If the quality engineer is insufficiently experienced, the tests may not accurately determine whether the new feature/function is operating correctly. Where the storage system is being used to store and provide access to critical data, this can result in data being lost or being unavailable.

FIG. 2 shows an example storage environment 150 and shows an example of how tests are executed in a storage environment 150. As shown in FIG. 2, in some embodiments a host 200 such as a personal computer runs a testcase creator application 300 (see FIGS. 3-5) that is used to generate tests that are submitted on the network of servers implementing the storage environment 100 (arrow 205). In some embodiments the tests are submitted to one or more Automation Management Servers (AMS) 210, which defines the resources required by the application to implement the test, and defines workflows that control the behavior of the test in the storage environment 150. The test, in some embodiments, is a container of cloud resources and workflow definitions that operate on those resources, and specify the type of operations to be performed on the storage systems 100 of the storage environment 150.

The automation management server 210 dispatches the tests (arrow 215) to one or more Automation Tools Servers (ATS) 220 that contains an automation engine daemon 222 to execute the tests on the storage systems 100. The automation engine daemon 222 is responsible to dispatch the testcase (arrow 225) and reserve the equipment for the given task/test on the storage system 100.

The result of the test, in some embodiments, is a pass/fail indication (arrow 235). The automation tools servers 220 reports/saves the test results (arrow 245) to the automation management server 210, which then passes the results back to the host 200 (arrow 255). The result of the tests can be analyzed by the host 200, and optionally further tests may be created using the testcase creator application 300 based on the results of the earlier tests.

Figure 3:
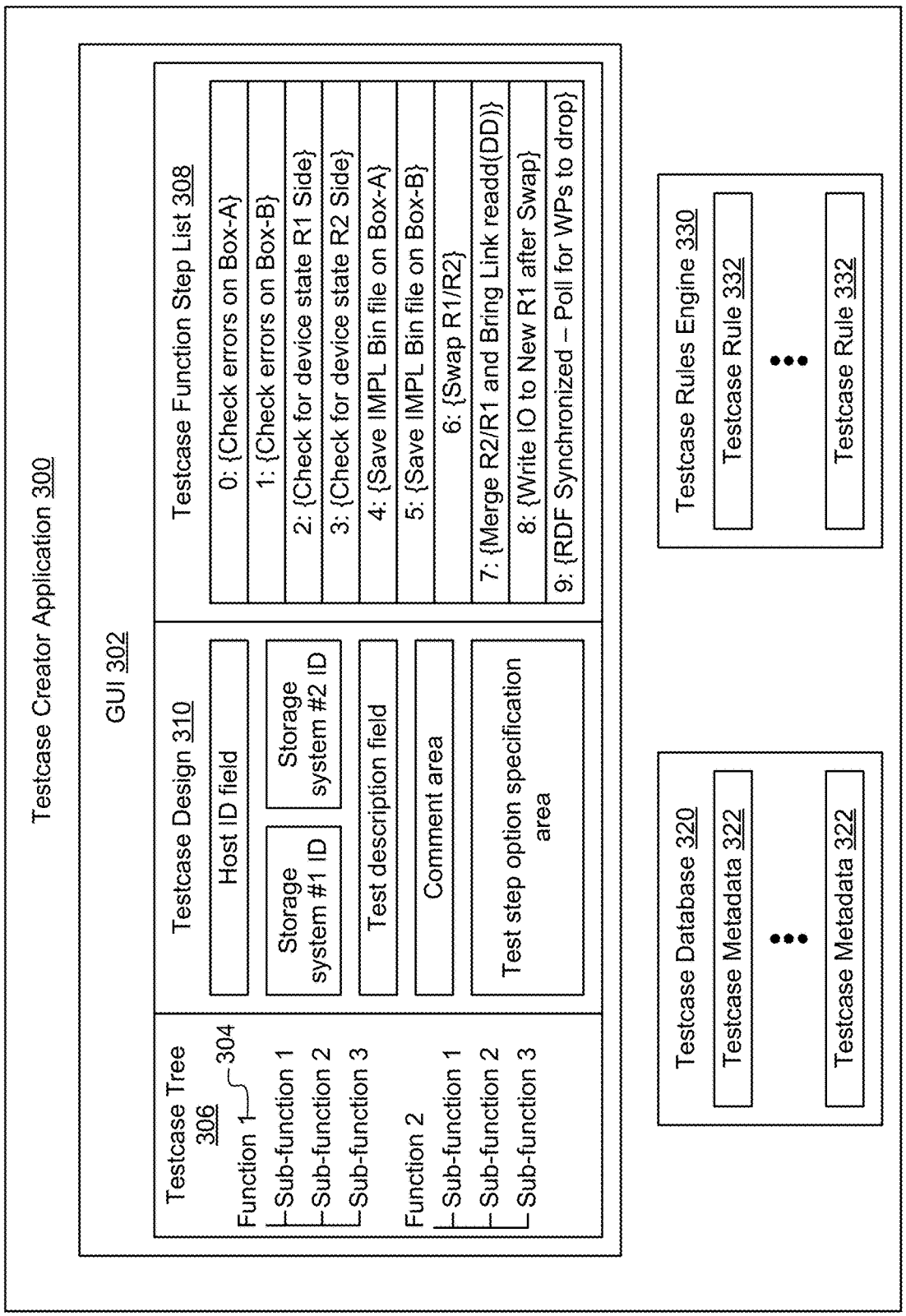
FIG. 3 is a functional block diagram of a testcase creator application for use in connection with generating testcases to be executed in a storage environment such as the storage environment of FIG. 2 according to some embodiments.

FIG. 3 is an example testcase creator application 300. As shown in FIG. 3, in some embodiments a testcase creator application 300 has a Graphical User Interface (GUI) 302 that a user will use to create a test when a new feature or a storage functionality of a storage system 100 is to be tested. The GUI 302 enables the user to select test functions 304 from a testcase tree 306 and drag the functions 300 to a testcase function step list 308. The GUI also has a testcase design area 310 through which various aspects of the test may be specified, for example a test description may be entered or comments may be added to provide additional context for the reason behind generating the test and what the test is intended to do. Different testcase creator applications 300 might have different GUIs, and the example testcase creator application 300 of FIG. 3 is intended to provide an example to illustrate how testcases can be created to execute in a storage environment 150.

In some embodiments, tests generated using the testcase creator application 300 are stored in a testcase database 320. The testcase database 320 includes testcase metadata 322 about each test created using the testcase creator application 300. Over time, the testcase metadata 322 of the testcase database 320 may include metadata describing hundreds or thousands of testcases that have been developed by skilled quality engineers to test numerous features of various deployed storage systems 100.

In some embodiments, the testcase creator application 300 further includes a testcase rules engine 330 containing sets of testcase rules 332 prohibiting testcases from being generated that are inoperable. For example, if a testcase is to be developed that is intended to test whether data is able to be written to a particular storage system 100, the testcase rules engine 330 might require the testcase to include a write data step before issuing a read data step. Numerous rules 332 might exist in the testcase rules engine 330 that prevent testcases from being generated that logically cannot return a pass result when issued to a storage system 100.

Figure 6:
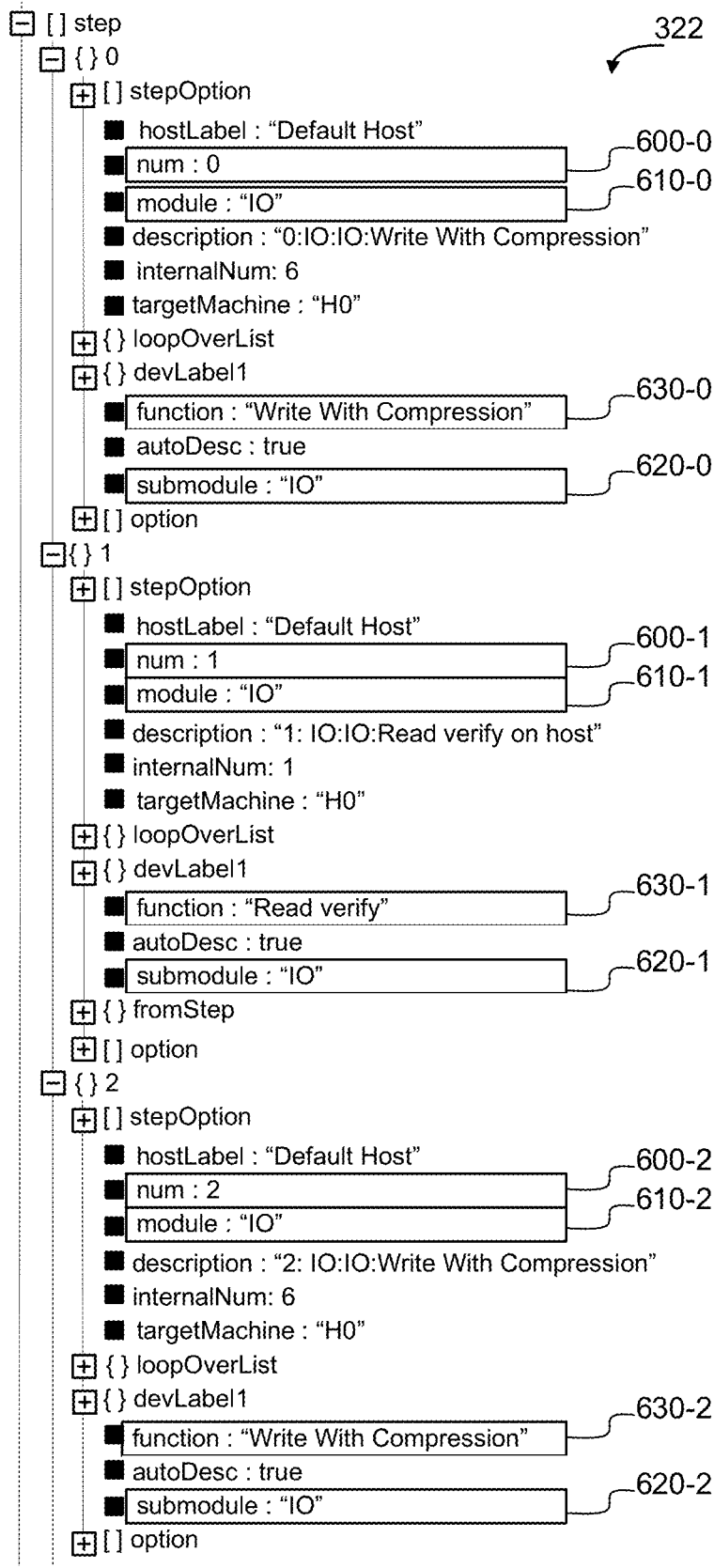
FIG. 6 is an example portion of metadata of an example testcase according to some embodiments.

FIG. 6 shows an example of testcase metadata 322 from an example testcase database 320 defining a portion of an example testcase. The testcase metadata 322 includes test information such as: test description, code release in which the test is introduced, and test steps needed to be executed, where each step includes four primary components: step number, module, subModule, and function.

In FIG. 6, boxes 600-0, 600-1, and 600-2 are drawn around the portions of the metadata identifying stepnumber identifiers 0, 1, and 2, respectively, of steps 0, 1, and 2 of the example testcase. Boxes 610-0, 610-1, and 610-2 are drawn around the portions of the metadata identifying the modules used in steps 0, 1, and 2, respectively. Boxes 620-0, 620-1, and 620-2 are drawn around the portions of the metadata identifying the subModules used in steps 0, 1, and 2, respectively. Boxes 630-0, 630-1, and 630-2 are drawn around the portions of the metadata identifying the functions performed in steps 0, 1, and 2, respectively. As shown in FIG. 6, in some embodiments each step in the metadata of a given testcase always includes these four components.

According to some embodiments, an artificial intelligence learning process (see FIGS. 4-5) uses the testcase metadata 322 from the testcase database 320, to extract information from the testcase database 320, to construct fingerprints for each testcase. The fingerprints are used by the learning process to eliminate redundant and duplicate testcases in the database, assist users with step recommendations when generating test cases using the testcase creator application, and to write new tests based on previous historical experience.

Figure 4:
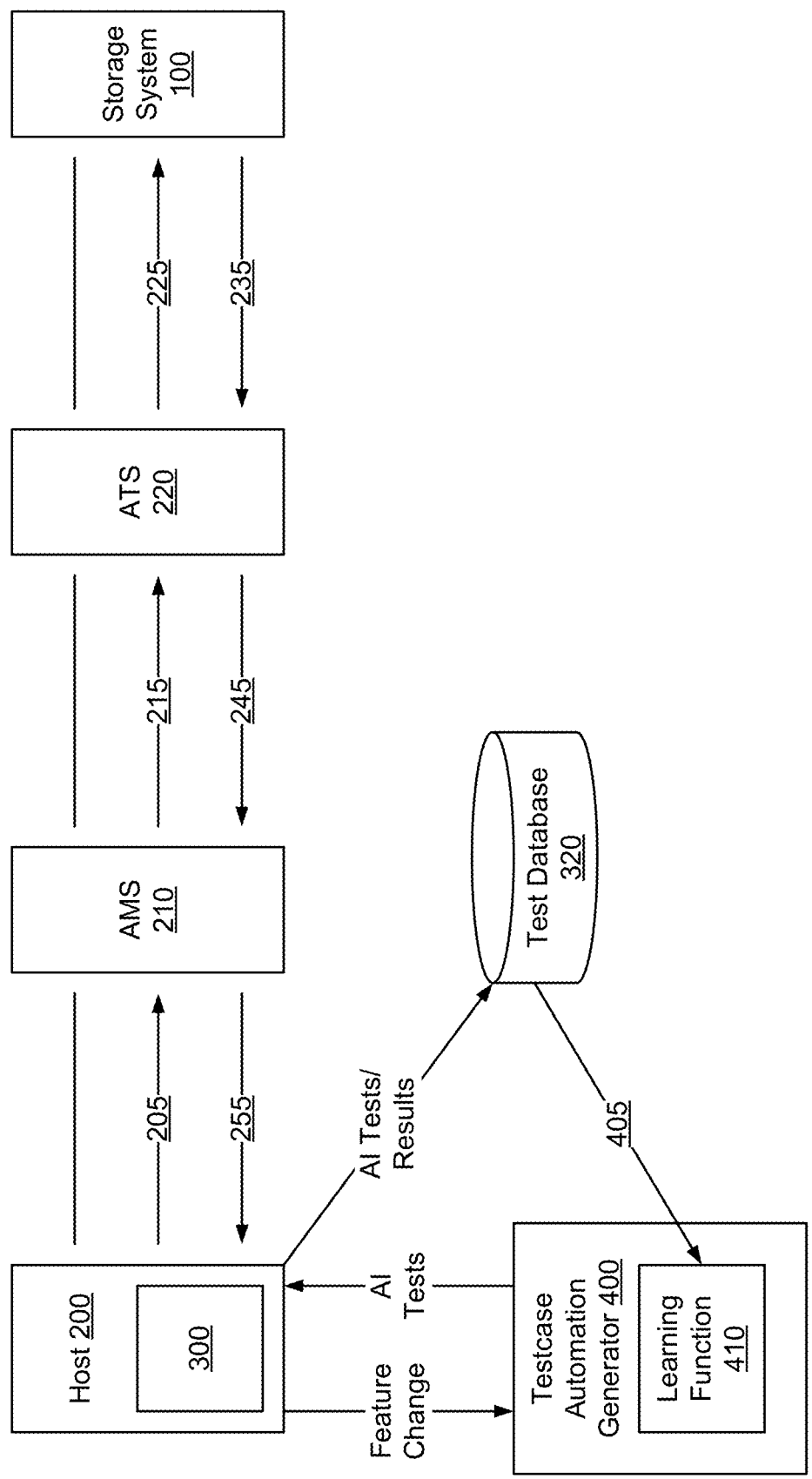
FIG. 4 is a functional block diagram of a storage environment including an AI powered testcase automation generator according to some embodiments.

FIG. 4 is a functional block diagram of a storage environment 150 implementing a testcase automation generator 400 to automatically generate tests to be executed on storage system 100 in the storage environment 150. As shown in FIG. 4, in some embodiments the testcase automation generator 400 includes a learning function 410. Testcase metadata 322 from the test database 320 is input to the learning function 410 as training input 405. The learning function 410, in some embodiments, is a deep learning network that uses the training input to analyze the testcases in the testcase database 320 to enable the learning function 410 to predict, based on a series of metadata, the next portion of the testcase to be created.

In some embodiments, a parameter referred to herein as a "steptask" is defined, and the "steptask" is used by the learning process 410 to parse the metadata in the testcase database 320. In some embodiments, the four components described above in connection with FIG. 6 are concatenated to define the "steptask", namely:

steptask=number||module||submodule||function

Each testcase includes multiple steps and, accordingly, multiple steptasks may be created from the metadata of a given testcase. In some embodiments, for each testcase, the learning function uses the steptasks that occur in the testcase metadata as well as the order of the steptasks in the metadata for the testcase, to learn the probability of what steptask will be executed next given an initial sequence of steptasks. For example, for deduplication, analysis shows that many tests perform the same sequence of steps—first the steptask 0=(0,IO,IO,Write Compression), next the steptask 1=(1,IO, IO,Read verify), then steptask 2=(2,IO,IO, Write Compression). This provides insight of a defined pattern that can be predicted by the learning process once properly trained. Other test similarly exhibit strongly correlated patterns that may be exploited by the learning process. In some embodiments, the learning function uses the steptasks and the sequences of steptasks from the testcase metadata as training to learn sequences of steptasks for types of tests. Once trained, the learning function has been configured to be used to help generate tests and is configured to predictively determine what steps should be included in a new test for an application, feature, or modification of a storage system 100 in storage environment 150.

Figure 7:
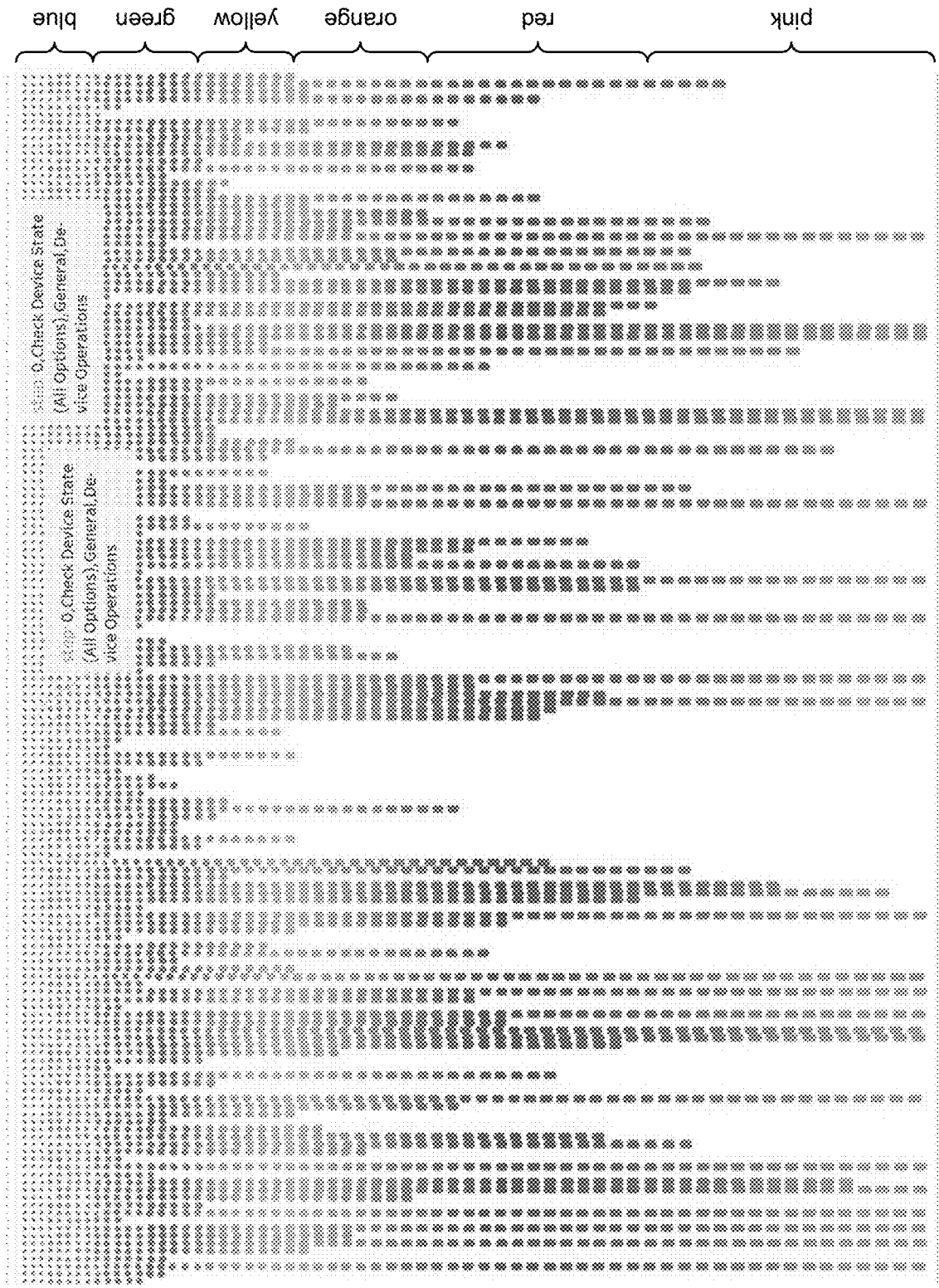
FIG. 7 is an example graph showing a correlation between steptasks in testcase metadata.

FIG. 7 is a steptask spectrum-map plot, in which each steptask is represented by a color, and the more color in the spectrum indicates the larger the step number, and the circle size indicates the value of the steptask. FIG. 7 plots the steptask data for testing Remote Data Forwarding (RDF), and shows that many test-cases share similar steptasks with the same step order.

Table I, set forth below, shows the probability of various steptasks for the first three steps of a set of testcases related to testing a deduplication feature of a storage system 100. The testcase database used for this analysis was maintained by the assignee of this application, EMC/Dell, although it would be expected that other testcase databases could be used to determine predicted correlations between steptasks of steps of testcases related to testing a feature of this nature. Note, in this table, that a steptask that starts with number 0 is associated with the first step in the analyzed testcases, a steptask that starts with the number 1 is associated with the second step in the analyzed testcases, and a steptask that starts with the number 2 is associated with the third step in the analyzed testcases. In this table, only entries with a probability greater than 1% were included

TABLE I

| Steptask | Percentage of testcases with this steptask |
| --- | --- |
| 0, IO, IO, Write With Compression | 27.27% |
| 0, IO, IO, Write | 3.03% |
| 0, General, Miscellaneous, Merge Device Lists | 2.02% |
| 0, Storage Resource Pools, SRP Operations, Pick SRP | 1.01% |
| 1, IO, IO, Read Verify | 27.27 |
| 1, IO, IO,Write | 2.02% |
| 1, Storage Resource Pools, SRP Operations, Pick SRP | 2.02% |
| 1, Storage Resource Pools, Get Devices, Get All Thin Devices on SRP | 1.01% |
| 1, IO, IO, Write With Compression | 1.01% |
| 2, IO, IO, Write With Compression | 28.28% |
| 2, IO, IO, Read Verify | 3.03% |
| 2, CG/DG/SG Operations, Storage Group, Remove Device Association | 2.02% |

As is clear from Table I, in the set of testcases analyzed from the testcase database that are related to deduplication, there is strong probability (27.27%) that the first step in the testcase is the steptask (0,IO,IO,Write With Compression). Likewise, there is a strong probability (27.27%) that the second step will be the steptask (0,IO,IO,Read Verify), and that the third step (28.28% probability) will be the steptask (2,IO,IO,Write With Compression).

A similar analysis was performed on testcases related to testing the snapshot application (SNAP) 122. Table II shows the results of this analysis. In this table, only entries with a probability greater than 3% were included.

TABLE II

| Steptask | Percentage of testcases with this steptask |
| --- | --- |
| 0, General, Device Operations, Check Device State (all options) | 16.98% |
| 0, General, Symmetrix Error Checking, Get Errors | 11.32% |
| 1, General, Device Operations, Check Device State (all options) | 16.98% |
| 1, General, Symmetrix Operations, InLines | 8.81% |
| 1, IO, IO, Write | 3.14% |
| 2, General, Device Operations, Check Device State (all options) | 11.32% |
| 2, IO, IO, Write | 14.47% |
| 2, LocalReplication (LR), SnapVx, Establish | 3.14% |

As is clear from Table II, in the set of testcases analyzed from the testcase database that are related to SNAP 122, certain steptasks show a high probability of being included in these testcases. This can be exploited by the learning function 410 to look for fingerprints of the test cases. Test cases with similar or identical fingerprints are potentially duplicates, which enables the learning function to eliminate duplicate testcases form the testcase database. Likewise, once trained, the learning function 410 can be used to assist users with step recommendations when the users are using the testcase creator application 300, and independently write new tests based on previous historical experience.

In some embodiments, the learning function is implemented using a deep learning mechanism named Bidirectional Long Short Term Memory (LSTM) network. LSTM networks are forms of recurrent neural networks that have persistence, which enables information to be passed from one step of the network to the next. Since the network retains information about what happened previously, it is able to use that information to more accurately predict what is likely to occur next. LSTM networks, in essence, are capable of learning and remembering information for a long time.

LSTM networks are good for analyzing sequences of values and predicting the next one. For example, a LSTM network can be used to predict the very next point of a given time series. For this reason, LSTM networks are often used in sentence and text prediction. According to some embodiments, the learning function 410 is implemented using a LSTM network, that receives as arguments the steptasks of the testcases. In some embodiments the testcase metadata 322 of the testcase database 320 is provided as training input to the learning function 410 to enable the learning function to be trained based on the existing metadata associated with testcases generated using the testcase creator application 300 over the preceding years. This information is used to train the learning function 410 to enable the learning function 410 to predict a subsequent steptask of a testcase when presented with an initial steptask of the testcase or an initial sequence of steptasks of the testcase.

In some embodiments, the learning function 410 is trained on a per-feature basis such that the learning function is separately trained using metadata of particular types of test-cases that were previously designed to train for a specific feature. For example, the learning function 410 may be trained using the set of testcases associated with deduplication, and then separately trained using the set of testcases associated with Snapshots (SNAP 122), or remote data forwarding. In some embodiments, the metadata of all testcases for a particular feature are read, and steptasks are created from the metadata. A dictionary containing all the steptasks that appear in the set of testcases for the particular feature is then created, which is provided to the learning function 410. The learning function then is provided with the metadata of all the testcases, and used to learn the probability of each steptask from the dictionary to be the next one of a given sequence.

Once the probabilities are learned, given a seed steptask the trained learning process is configured to predict the next steptask in the sequence. Once the next steptask is drawn from the dictionary, it is added to the end of the sequence. Then, the learning process determines the next steptask for this new sequence. For example, once the learning function 410 has been trained on the deduplication test cases to learn the probabilities shown in Table I, if the learning function 410 is used to generate a new test case for a deduplication function and is given a seed steptask (0,IO,IO,Write With Compression), the learning function will predict that the next steptask should be (1,IO,IO,Read verify). Similarly, given a seed sequence including the first steptask (0,IO,IO, Write With Compression) and second steptask (1,IO,IO, Read verify), the learning process will predict that the next steptask for the new deduplication function testcase should be (2,IO,IO,Write with compression).

According to some embodiments, the learning function 410 tries to understand testcase automation language without being explicitly programmed, where the system starts analyzing the training set to build its own knowledge, produce its own rules, and its own predictors. One advantage of the AI-based test automation is this learnability. However, since the model is based on probabilistic results, it is possible for the learning function to suggest an incorrect step when prompting an individual creating a testcase, or may create a testcase that has one or more steps missing or out of order. In some embodiments, the step suggestions and learning function generated testcases are passed through the testcase rules engine 330 to enable rules to be enforced when predicting next steps.

Figure 5:
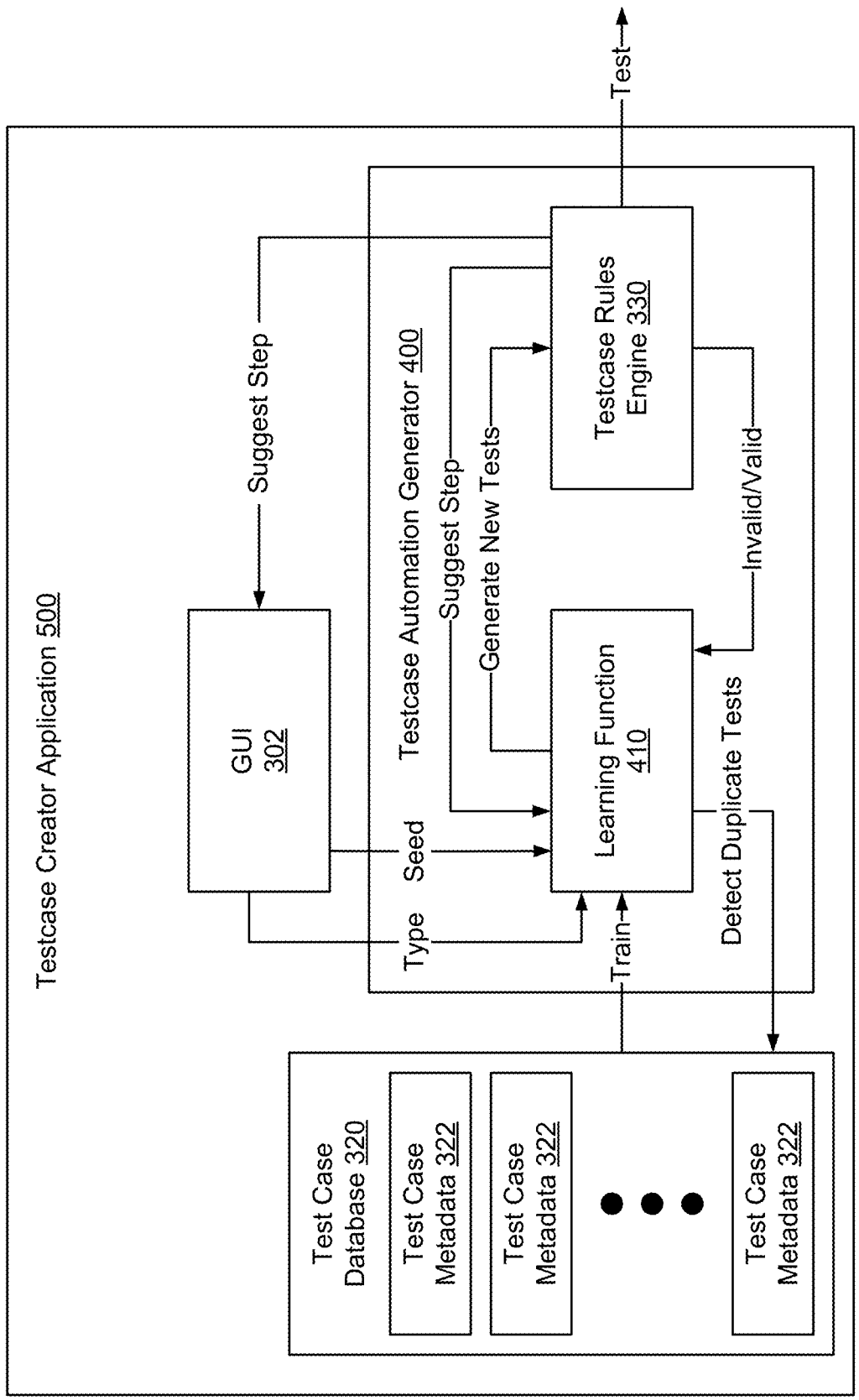
FIG. 5 is a functional block diagram of a testcase creator application including a testcase automation generator for use in connection with generating testcases to be executed in a storage environment such as the storage environment of FIG. 2 according to some embodiments.

FIG. 5 is a functional block diagram of an example testcase creator application 500. As shown in FIG. 5, the testcase creator application 300 includes a testcase database 320 with testcase metadata 322. The testcase metadata 322 describes tests that previously have been generated using the testcase creator application 500 or another application to test aspects of storage systems 100. This testcase metadata 322 is read by the learning function 410 as described above, by parsing the testcase metadata 322 to learn correlations between steptasks of testcases that were used in connection with testing particular features of the storage system 100.

As the learning function 410 processes the testcase metadata 322, it creates fingerprints of each testcase which can be used to detect duplicate tests in the testcase database 320. Optionally, the duplicate tests may be removed from the testcase database 320.

The learning process 410, once trained, can also be used to predict next steps which can be used to guide a user of the testcase creator application 500 or to generate new tests. For example, as shown in FIG. 5, if a person is interacting with the testcase creator application 500 and is creating a new testcase using GUI 302, the current set of steptasks selected by user via the GUI 302 may be provided to the learning process 410, to act as a seed which the learning process 410 can use to determine and suggest a subsequent steptask or sequence of steptasks that should be added to the new testcase. Optionally, the suggested subsequent steptask may be passed through the testcase rules engine 330 prior to being suggested to the user via the GUI 302.

Likewise, in some embodiments, a user of the testcase creator application 500 can use the GUI 302 to indicate that a particular feature is to be tested. Based only on the selected feature, the learning process 410 can use the probabilities learned from previous testcases associated with the particular feature to generate a new test containing a sequence of steptasks that should be used to test the new feature. The generated new test, optionally, may be passed through the testcase rules engine 330 prior to appearing in the GUI 302. The generated test may be reviewed by the user of the testcase creator application 500 in the GUI 302 and tweaked/modified before being issued to the target storage system. Alternatively, the generated test may be automatically issued to the target storage system 100 to execute in the storage environment 150, and the results of the test passed back and used to continue training of the learning function 410.

The methods described herein may be implemented as software configured to be executed in control logic such as contained in a Central Processing Unit (CPU) or Graphics Processing Unit (GPU) of an electronic device such as a computer. In particular, the functions described herein may be implemented as sets of program instructions stored on a non-transitory tangible computer readable storage medium. The program instructions may be implemented utilizing programming techniques known to those of ordinary skill in the art. Program instructions may be stored in a computer readable memory within the computer or loaded onto the computer and executed on computer's microprocessor. However, it will be apparent to a skilled artisan that all logic described herein can be embodied using discrete components, integrated circuitry, programmable logic used in conjunction with a programmable logic device such as a Field Programmable Gate Array (FPGA) or microprocessor, or any other device including any combination thereof. Programmable logic can be fixed temporarily or permanently in a tangible computer readable medium such as random-access memory, a computer memory, a disk, or other storage medium. All such embodiments are intended to fall within the scope of the present invention.

Throughout the entirety of the present disclosure, use of the articles "a" or "an" to modify a noun may be understood to be used for convenience and to include one, or more than one of the modified noun, unless otherwise specifically stated.

Elements, components, modules, and/or parts thereof that are described and/or otherwise portrayed through the figures to communicate with, be associated with, and/or be based on, something else, may be understood to so communicate, be associated with, and or be based on in a direct and/or indirect manner, unless otherwise stipulated herein.

Various changes and modifications of the embodiments shown in the drawings and described in the specification may be made within the spirit and scope of the present invention. Accordingly, it is intended that all matter contained in the above description and shown in the accompanying drawings be interpreted in an illustrative and not in a limiting sense. The invention is limited only as defined in the following claims and the equivalents thereto.

What is claimed is:

1. A method of generating recommendations for a testcase creator application, comprising the steps of:
    training a learning function using metadata of previously generated testcases, each test case including multiple steps, by parsing the metadata of the previously generated testcases into steptasks and sequences of steptasks and providing the parsed metadata to the learning function, to enable the learning function to learn the probability of what steptask will be executed next given an initial sequence of steptasks; and
    obtaining a seed steptask by the testcase creator application, providing the seed steptask to the trained learning function, and using, by the testcase creator application, the trained learning function to obtain a predicted subsequent steptask for a given type of testcase to be generated and the seed steptask;
    wherein each of the previously generated testcases includes a plurality of steps, and the step of parsing the metadata into steptasks comprises creating a steptask for each of the plurality of steps; and
    wherein each steptask describes one of the steps of the testcase using a concatenation of a step number of the one of the steps of the testcase, a module and a submodule to be used to perform of the one of the steps of the testcase, and a function to be performed at the one of the steps of the testcase.

2. The method of claim 1, wherein the predicted subsequent steptask is based on the given type of testcase to be generated and the seed steptask.

3. The method of claim 1, wherein the seed steptask is a steptask of a new testcase to be generated by the testcase creator application.

4. The method of claim 3, wherein the seed steptask is a first steptask of the new testcase to be generated by the testcase creator application.

5. The method of claim 1, further comprising using the parsed metadata to determine duplicate testcases.

6. The method of claim 5, wherein the step of using the parsed metadata comprises using the steptasks to create testcase fingerprints for each of the previously generated testcases, and comparing the testcase fingerprints to determine the duplicate testcases.

7. The method of claim 1, further comprising analyzing an output of the learning function using a testcase rules engine to validate the output of the learning function.

8. A storage environment, comprising:
    a plurality of storage systems;
    a testcase creator application configured to create testcases to be executed in the storage environment; and
    a testcase automation generator, the testcase automation generator containing control logic configured to:
        train a learning function using metadata of previously generated testcases, each test case including multiple steps, by parsing the metadata of the previously generated testcases into steptasks and sequences of steptasks and providing the parsed metadata to the learning function to enable the learning function to learn the probability of what steptask will be executed next given an initial sequence of steptasks;
        receive, as input from the testcase creator application, a type of testcase to be generated and a seed steptask;
        use the trained learning function to obtain a predicted subsequent steptask based on the type of testcase to be generated and the seed steptask; and
        provide the predicted subsequent steptask to the testcase creator application;
    wherein each of the previously generated testcases includes a plurality of steps, and the control logic configured to parse the metadata into steptasks is further configured to create a steptask for each of the plurality of steps; and
    wherein each steptask describes one of the steps of the testcase using a concatenation of a step number of the one of the steps of the testcase, a module and a submodule to be used to perform of the one of the steps of the testcase, and a function to be performed at the one of the steps of the testcase.

9. The storage environment of claim 8, wherein the predicted subsequent steptask is based on the given type of testcase to be generated and the seed steptask.

10. The storage environment of claim 8, wherein the seed steptask is a steptask of a new testcase to be generated by the testcase creator application.

11. The storage environment of claim 10, wherein the seed steptask is a first steptask of the new testcase to be generated by the testcase creator application.

12. The storage environment of claim 8, further comprising control logic configured to use the parsed metadata by the learning function to determine duplicate testcases.

13. The storage environment of claim 12, wherein the control logic configured to use the parsed metadata is configured to use the steptasks to create testcase fingerprints for each of the previously generated testcases, and compare the testcase fingerprints to determine the duplicate testcases.

14. The storage environment of claim 8, further comprising a testcase rules engine, and control logic configured to analyze an output of the learning function using the testcase rules engine to validate the output of the learning function.

\* \* \* \* \*